US012724055B2

(12) United States Patent
Celik et al.

(10) Patent No.: US 12,724,055 B2
(45) Date of Patent: Sep. 1, 2026

(54) TEST AND/OR MEASUREMENT INSTRUMENT AND TEST AND/OR MEASUREMENT SYSTEM

(71) Applicant: Rohde & Schwarz GmbH & Co. KG, Munich (DE)

(72) Inventors: Mert Celik, Munich (DE); Baris Guezelarslan, Munich (DE); Daniel Mueller-Remer, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 176 days.

(21) Appl. No.: 18/740,848

(22) Filed: Jun. 12, 2024

(65) Prior Publication Data

US 2025/0383388 A1 Dec. 18, 2025

(51) Int. Cl.
*G01R 29/26* (2006.01)
*G01R 35/00* (2006.01)

(52) U.S. Cl.
CPC .......... *G01R 29/26* (2013.01); *G01R 35/005* (2013.01)

(58) Field of Classification Search
None
See application file for complete search history.

(56) References Cited

U.S. PATENT DOCUMENTS 5,191,294 A 3/1993 Grace et al.
5,416,422 A 5/1995 Dildine
6,114,858 A 9/2000 Kasten
10,761,134 B2 * 9/2020 Lagler ................ G01R 31/2879
11,112,447 B1 9/2021 Martens
11,874,312 B1 * 1/2024 Lagler .............. G01R 31/31709
12,345,742 B2 * 7/2025 Ramian .............. G01R 13/0218
12,416,665 B2 * 9/2025 Ramian .................. G01R 29/26
12,467,829 B2 * 11/2025 Lloyd .................. G06F 11/273
2005/0137814 A1 6/2005 Kelly et al.
2018/0302179 A1 * 10/2018 Leibfritz ................ G01R 27/32
2023/0106890 A1 * 4/2023 Ramian ................ H04B 17/345 375/224
2023/0280373 A1 * 9/2023 Ramian .................. G01R 29/26 324/76.39
2024/0027524 A1 * 1/2024 Petzsch .............. G01R 31/2889
2024/0039647 A1 * 2/2024 Ramian .............. H04B 17/0085
2024/0319248 A1 * 9/2024 Ramian .................. G01R 29/26
(Continued)

FOREIGN PATENT DOCUMENTS

DE 10 2018 128 64 A1 5/2020

*Primary Examiner* — Jermele M Hollington
(74) *Attorney, Agent, or Firm* — CHRISTENSEN O'CONNOR JOHNSON KINDNESS PLLC

(57) ABSTRACT

A test and/or measurement instrument has a signal generator circuit configured to generate a test signal with a band-limited noise signal, a first port and a second port. The instrument has a first path connected with the first port and the signal generator circuit such that the test signal generated by the signal generator circuit is forwarded to the first port. The instrument has a second path connected with the second port. The has a measurement circuit that receives a measurement signal from the second path, which corresponds to the test signal being processed by the device under test. The measurement circuit is configured to receive the test signal. The measurement circuit is configured to determine a noise contribution of the device under test to the measurement signal based on the test signal and the measurement signal.

20 Claims, 5 Drawing Sheets

(56) References Cited

U.S. PATENT DOCUMENTS

| | | | | |
|---|---|---|---|---|
| 2024/0410941 | A1* | 12/2024 | Ramian | G01R 31/3167 |
| 2025/0306155 | A1* | 10/2025 | Mueller-Remer | G01R 31/2834 |
| 2025/0316258 | A1* | 10/2025 | Ramian | G10K 11/17825 |
| 2025/0334623 | A1* | 10/2025 | Steffens | G01R 29/0864 |
| 2025/0370029 | A1* | 12/2025 | Ramian | G01R 31/2822 |
| 2026/0081705 | A1* | 3/2026 | Ruengeler | H04B 17/318 |

* cited by examiner

DDS Time Domain
DDS Frequency Domain
DDS Time Domain: noise-like signal
DDS Frequency Domain: noise-like signal
DDS Time Domain: noise-like signal
DDS Frequency Domain: CW tone with excess phase noise

TEST AND/OR MEASUREMENT INSTRUMENT AND TEST AND/OR MEASUREMENT SYSTEM

FIELD OF THE DISCLOSURE

Embodiments of the present disclosure relate to a test and/or measurement instrument for noise measurements of a device under test. Further, embodiments of the present disclosure relate to a test and/or measurement system for noise measurements.

BACKGROUND

In the state of the art, test and/or measurement instruments, for instance vector network analyzers (VNAs), are known for performing a noise measurements of a device under test, for example determining a noise figure of the device under test.

Generally, the noise measurements performed rely on measuring a signal received from the device under test with different detectors, for instance a root-mean-square (RMS) detector and an average (AVG) detector, while considering the differences of the measurement results obtained from the different detectors. This method is based on the idea that noise power only manifests itself with root-mean-square detectors and not with average detectors.

It is known that the front end of the test and/or measurement instrument, e.g. mixers of the frond end, may introduce non-linearities or imperfections which cause problems when determining the noise contribution of the device under test, for example the noise figure. In an embodiment, noise at side bands, noise at spur frequencies and/or noise at local oscillator (LO) spur frequencies may be converted to the intermediate frequency (IF) such that those noise contributions are measured as in-band noise, thereby distorting the measurement results. This concept is called noise folding.

To overcome this problem, it is known in the state of the art to perform multiple measurements at different local oscillator frequencies and/or with different IF filters in order to assess and eliminate out-of-band noise contributors, thereby obtaining more accurate measurement results.

However, it has turned out that the accuracy of the noise measurements can be improved further.

Accordingly, there is a need for faster and more accurate noise measurements.

SUMMARY

The following summary of the present disclosure is intended to introduce different concepts in a simplified form that are described in further detail in the detailed description provided below. This summary is neither intended to denote essential features of the present disclosure nor shall this summary be used as an aid in determining the scope of the claimed subject matter.

Embodiments of the present disclosure provide a test and/or measurement instrument for noise measurements of a device under test. In an embodiment, the test and/or measurement instrument comprises a signal generator circuit that is configured to generate a test signal comprising a band-limited noise signal. The test and/or measurement also comprises a first port connectable to the device under test as well as a second port connectable to the device under test. The test and/or measurement instrument further comprises a first path connected with the first port and the signal generator circuit such that the test signal generated by the signal generator circuit is forwarded to the first port via the first path. The test and/or measurement instrument further comprises a second path connected with the second port. The test and/or measurement instrument comprises a measurement circuit that receives a measurement signal from the second path, which corresponds to the test signal being processed by the device under test. The measurement circuit is also configured to receive the test signal. The measurement circuit is configured to determine a noise contribution of the device under test to the measurement signal based on the test signal received and the measurement signal received from the second path.

Embodiments of the present disclosure also provide a test and/or measurement system for noise measurements. In an embodiment, the test and/or measurement system comprises a device under test and the test and/or measurement instrument as described above. The device under test is connected with the first port and the second port of the test and/or measurement instrument. Accordingly, the test signal forwarded to the first port via the first path is received by the device under test that processes the test signal, thereby generating a signal that is forwarded to the second port of the test and/or measurement instrument, for example the second path connected with the second port. The signal inputted to the second port corresponds to the measurement signal that is received by the measurement circuit from the second path.

The main idea of the present disclosure relates to using a specific test signal for performing the noise measurements of the device under test, as the test signal comprises the band-limited noise signal. This ensures that the respective noise is only apparent in a specific frequency band which is used for testing the noise contribution of the device under test. In other words, the subject matter of the present disclosure differs from solutions known in the state of the art, which are based on a broadband noise source for providing the noise signal used for performing the noise measurements of the device under test. The band-limited noise signal ensures that the noise signal introduced only relates to a specific frequency band rather than the specific frequency band and its image band with respect to the local oscillator signal used by the front end of the test and/or measurement instrument for mixing down the signal to the intermediate frequency for further processing. Therefore, noise at side bands, at spur frequencies and/or at local oscillator spur frequencies can be avoided efficiently such that they are not converted to the intermediate frequency and not measured as in-band noise inadvertently.

In addition, it is not necessary to perform multiple measurements at different local oscillator frequencies for obtaining accurate measurement results, thereby reducing the overall time required for performing the noise measurements of the device under test.

Generally, the band-limited noise signal means that no side band correction is needed.

Since the test and/or measurement instrument ensures accurate noise measurements, no restrictions with regard to the device under test have to be considered when performing the noise measurements. In the state of the art, devices under test shall have a gain higher than 30 dB and a noise figure higher than 5 dB to get accurate noise figure measurements within acceptable measurement time. This restriction does not apply for the test and/or measurement instrument anymore due to the new concept set forth in the present application.

An aspect provides that the measurement circuit, for example, is coupled with the first path. Hence, the measurement circuit receives the test signal from the first path and processes the test signal internally to obtain information used by the measurement circuit for determining the noise contribution of the device under test by considering the test signal and the measurement signal. In an embodiment, the measurement circuit receives the test signal and the measurement signal in a similar manner from the first path and the second path, respectively.

A further aspect provides that the first path and the second path, for example, both are coupled with the measurement circuit by a respective coupler, for instance a directional coupler. Therefore, no electrical line is provided between the first path and the measurement circuit as well as between the second path and the measurement circuit. In other words, a galvanic isolation of the measurement circuit is realized with respect to the first path and the second path, respectively.

Alternatively, the second path may be electrically connected with the measurement circuit by a line. Put differently, a receiver side of the measurement circuit is electrically connected with the second port by the line. Therefore, only the first path may be galvanically isolated from the measurement circuit, whereas the second path is electrically connected with the measurement circuit, thereby ensuring better noise measurements by the measurement circuit.

A further aspect provides that the second path, for example, is connected with the signal generator circuit. Therefore, the first path and the second path may be altered with regard to their respective functionality, for example depending on a mode of the test and/or measurement instrument. For instance, full and complete calibration of the test and/or measurement instrument as well as testing the device under test with regard to the scattering parameters (S-parameters) can be ensured.

In an embodiment, the test and/or measurement may have a housing that encompasses the signal generator circuit and the measurement circuit. The test and/or measurement instrument is a single device that provides the respective functionalities described above. The device under test is a device that is separately formed with respect to the test and/or measurement instrument, but connected with the test and/or measurement instrument by electrical lines, for instance cables.

According to a certain embodiment, the signal generator circuit is configured to generate a continuous wave (CW) signal in parallel to the band-limited noise signal such that the test signal comprises the continuous wave signal and the band-limited noise signal that overlaps the continuous wave signal. In other words, the continuous wave signal is buried in the band-limited noise signal. This ensures that noise measurements can be performed in the non-linear regime of the device under test, for example in the non-linear regime of an amplifier of the device under test, rather than only in linear operating conditions as it is done in the state of the art. The continuous wave signal is used to drive the device under test, for example its amplifier, in the non-linear regime, whereas the additional band-limited noise signal is used as excess noise such that the noise contribution of the device under test can be determined for the device under test in its non-linear regime.

Generally, the continuous wave (CW) signal and the band-limited noise signal may also be provided separately.

For example, the signal generator circuit is configured to set the power level of the continuous wave signal such that the signal generated causes a saturation of the device under test. This ensures that noise measurements of the device under test can be performed in its saturation condition. In an embodiment, the device under test can be tested over its entire operational range, namely up to its saturation condition, in a reliable manner. This is especially useful for measurements where low-noise amplifiers are used in saturation condition, e.g. clock or mixer drivers or power amplifiers.

In an embodiment, the signal generator circuit may be configured to sweep the continuous wave signal through a defined frequency band with defined frequency steps. Thus, a frequency modulated (FM) noise signal can be generated, for example at specific frequency bands.

In an embodiment, the signal generator circuit may be configured to change a power level of the continuous wave signal and/or the band-limited noise signal at least for some of the defined frequency steps. Generally, the power level of the continuous wave signal and the band-limited noise signal may be changed independently of each other. The measurement circuit is enabled to measure various measurement signals for the different power levels of the continuous wave signal and/or the band-limited noise signal. For instance, the device under test might be saturated at least for some power levels. The noise level can be changed for the same frequency of the continuous wave signal in case it is desired to obtain information of the device under test for two different noise levels at the same frequency of the continuous wave signal.

According to another aspect, the measurement circuit, for example, may be coupled with the first path such that the measurement circuit is configured to receive the test signal from the first path and to digitize the test signal received, thereby generating a digitized test signal based on which the noise contribution of the device under test with the measurement signal is determined. In an embodiment, the analog test signal is received by the measurement circuit via the coupler, e.g. the directional coupler, wherein the analog test signal received is digitized in order to obtain the digitized test signal for being processed further such that the noise contribution of the device under test can be determined.

In an embodiment, the measurement circuit may generally comprise a transmission side for receiving the test signal and/or a reception side for receiving the measurement signal.

In an embodiment, the transmission side of the measurement circuit may be associated with a down-conversion of the test signal, e.g. for instance an analog and/or digital mixing stage.

On reception side, the measurement circuit in an embodiment may be enabled to digitize the measurement signal, thereby generating a digitized measurement signal. Hence, the measurement circuit is enabled to process the digitized test signal and the digitized measurement signal in a digital manner in order to determine the noise contribution of the device under test to the measurement signal.

Alternatively, the measurement circuit may be configured to receive a digital waveform of the test signal from a storage medium, namely a digital version of the test signal, e.g. data representing the test signal. The measurement circuit is configured to calculate the noise contribution of the device under test to the measurement signal based on the digital waveform received. In general, the measurement circuit may digitize the measurement signal. The measurement circuit is enabled to process both, namely the digital waveform received via the interface as well as the digitized measurement signal, in order to calculate the noise contribution of the device under test.

In an embodiment, the measurement circuit may be configured to consider an amplification of the device under test and/or a noise contribution of the second path when determining the noise contribution of the device under test to the measurement signal. The amplification of the device under test may be measured by measuring the amplification of the continuous wave signal added to the first port.

In an embodiment, the noise contribution of the second path can be measured in a calibration step. A match may be connected to the second port, for instance a 50 Ohm match. Then, the noise signal can be measured accordingly. Therefore, any noise contributors apparent in the second path are determined in the calibration step such that these noise contributors can be considered when determining the noise contribution of the device under test to the measurement signal.

According to a further aspect, the test and/or measurement instrument comprises, for example, a calibration mode. The first port is connected with the second port via a line in the calibration mode, which is used for connecting the device under test. For instance, the line connects the device under test to the first port or to the second port of the test and/or measurement instrument. The measurement circuit is configured to measure the test signal forwarded to the second path in order to determine the band-limited noise signal as part of the measured test signal. Based thereon, the contribution of the second path to the overall noise can be derived which is used for determining the noise contribution of the device under test afterwards.

In general, the measurement circuit may be configured to calculate a noise figure of the device under test based on the noise contribution of the device under test. The gain of the device under test and/or the noise figure of the test and/or measurement instrument, for example its measurement circuit and the second path, are/is taken into account as well.

In an embodiment, the noise figure may be calculated by using the Y factor technique for noise figure measurements. Such a technique is described in the corresponding Application Note "THE Y FACTOR TECHNIQUE FOR NOISE FIGURE MEASUREMENTS" located at the following IP address:

https://scdn.rohde-schwarz.com/ur/pws/dl_downloads/dl_application/application_notes/1ma178/1MA178_5e_NoiseFigure.pdf The contents of corresponding note found at the IP address provided above is incorporated by reference in its entirety.

According to a certain embodiment, the signal generator circuit comprises at least one direct-digital-synthesis, DDS, circuit that is configured to generate the band-limited noise signal. Generally, DDS is one of many ways of digitally creating band-limited noise signals which however is less expensive and/or complex compared to other technologies, e.g. driving direct-to-analog converters, DACs, with digital data, which is also called point per clock.

In an embodiment, the DDS circuit relates to a DDS-based signal source that creates a frequency-modulated noise-like signal, namely the band-limited noise signal. The DDS technology is enabled to tune very fast such that the frequency-modulated noise-like signal can be created accordingly, which is used for performing the noise measurements.

In an embodiment, the DDS circuit may also be configured to generate the continuous wave signal.

In general, direct-digital-synthesis (DDS) is a technique for using digital data processing blocks for generating a frequency-and phase-tunable output signal referenced to a fixed-frequency precision clock source. The reference clock frequency is divided down in a DDS architecture by the scaling factor set forth in a programmable binary tuning word. The tuning word is typically 24-48 bits long which enables a DDS implementation to provide superior output frequency tuning resolution.

In other words, direct-digital-synthesis (DDS) is a way to create an output signal by tuning/changing/dividing a phase of a precise reference clock signal. Tuning/changing/dividing the phase is accomplished according to the digital frequency tuning word, set in the predefined registers of the corresponding chip. DDS chips typically integrate all required functional blocks to achieve what is called "Complete DDS solution", thereby offering cost competitiveness and high performance.

A digital functional block, also called "phase accumulator", allows a DDS to operate similar to a numerically controlled oscillator. In an embodiment, the phase accumulator jumps a "phase step" in each clock cycle and the size of the "phase step" is determined by the digital frequency tuning word. By changing a single register, namely the frequency tuning word, the output phase step size can be changed in a highly flexible manner.

Since frequency, by definition, is given as the derivative of the phase with respect to time, changing phase steps have direct effect on the output frequency. Phase accumulators' output goes to a phase to amplitude converter. The phase values are mapped to the corresponding amplitude values of a sine wave. This "digital sine wave" is converted to the analog output signal with a digital to analog converter, DAC.

As discussed above, the DDS architecture generally allows fast frequency hopping. This can be used to create a band-limited noise signal based on FM modulation. A baseband noise signal can be created digitally, for instance on an FPGA, using m-sequences or with an analog manner using noise voltage output of diodes. This pseudo-random or random baseband signal can be mapped/converted to the digital frequency tuning word of the DDS to control the output frequency within the frequency range of interest.

For example, a user may generate a band-limited noise signal between frequencies F1 and F2. Hence, a baseband random or pseudo-random is generated. Baseband noise data is mapped to digital frequency tuning words. The DDS outputs the waveform. During operation, the digital frequency tuning word is changed depending on the baseband noise data. Consequently, a band-limited noise like signal is generated.

Further information with regard to a DDS and its usage for creating a band-limited noise signal can be found in "A Technical Tutorial on Digital Signal Synthesis", 1999, by Analog Devices, Inc., the paper "FM Noise Generator Based on Hybrid Method" by Zhan et. al, published in course of the 3rd IFAC International Conference on Intelligent Control and Automation Science, Sep. 2-4, 2013, Chengdu, China, or the paper "Method Research and Realization of Noise FM Jamming Based on DDS Technology" by Chuyang et. al., published in Journal of Physics: Conference Series, 2019 2nd International Symposium on Big Data and Applied Statistics. Each of these references are incorporated by reference in their entirety.

In an embodiment, the signal generator circuit may be configured to change an outputted frequency of the at least one direct-digital-synthesis circuit within each clock cycle of the at least one DDS circuit for at least two consecutive clock cycles. In an embodiment, this can be done for two, three, four, five, six, seven, eight, nine or at least ten consecutive clock cycles. By changing frequency tuning word of the DDS very fast, the frequency-modulated noise-like signal is obtained.

In an embodiment, the signal generator circuit may be configured to change an output frequency of the at least one direct-digital-synthesis circuit by amending a phase register of the at least one DDS circuit. Accordingly, the at least one DDS circuit has a phase register, for instance as part of a phase accumulator. Besides the phase register, the at least one DDS circuit may also comprise a N-bit variable modulus counter that processes the tuning words.

As mentioned above, the DDS circuit may generate the continuous wave signal together with the band-limited noise signal. Since the resolution of the test signal generated by the DDS circuit is high compared to the frequency steps for which the continuous wave signal is changed, a frequent change of the output frequency of the DDS circuit and, therefore, a frequent change of the continuous wave signal for each clock cycle of the DDS circuit still ensures reliable measurements. For instance, the continuous wave signal may have a frequency of 100 MHz for clock cycle 0, a frequency of 100,0000001 MHz for clock cycle 1 and a frequency of 99,9999999 MHz for clock cycle 2.

In an embodiment, the at least one direct-digital-synthesis circuit can also be used to create shaped-noise around a continuous wave (CW) tone. The shape can simulate a clock with a known phase noise characteristics. Hence, excess phase noise measurements for devices with relatively high excess phase noise contribution can be performed by using the test and/or measurement instrument.

In an embodiment, the test and/or measurement instrument may be a vector network analyzer or a spectrum analyzer. Thus, the test and/or measurement instrument is a single device having the respective functionality of a vector network analyzer or a spectrum analyzer. In addition to the known functionalities, the test and/or measurement instrument further ensures to perform noise figure measurements in the non-linear regime of the device under test. Furthermore, excess phase noise measurements may also be performed by the test and/or measurement instrument.

As already discussed above, the Y factor technique for noise figure measurements can be used due to the DDS-based in-band noise generated in order to assess the noise figure of the device under test without taking into account noise contributions from sidebands, at spur frequencies, and/or at local oscillator (LO) spur frequencies. This can be ensured since the band-limited noise signal, namely a frequency-restricted noise signal, is used which would only add-up with the noise of the device under test at a given frequency range. Consequently, it does not cause any problems at the front-end of the test and/or measurement instrument, for example a mixer. In contrast thereto, using a wideband noise source might cause interferences with sidebands, at spur frequencies, and/or at local oscillator (LO) spur frequencies, which end up at the intermediate frequency.

Accordingly, the test and/or measurement instrument according to embodiments of the present disclosure ensure a noise (figure) measurement of the device under test.

Generally, it is possible to perform a noise figure measurement of a mixer by the test and/or measurement instrument. Put differently, the device under test in an embodiment is a mixer. Mixers typically have three ports, wherein the test and/or measurement instrument provides a local oscillator signal to the mixer, for example its third port.

In an embodiment, the test and/or measurement system may comprise the test and/or measurement instrument described above. Therefore, the respective aspects mentioned above do also apply to the test and/or measurement system in a similar manner.

In an embodiment, the test and/or measurement system may comprise an impedance tuner that is arranged between the first port and the device under test or between the second port and the device under test. The impedance tuner may be used for adding an impedance during a calibration step of the test and/or measurement system.

In an embodiment, the impedance tuner is used for calculating the noise parameters of the second path and the receiver side of the measurement circuit and/or the device under test.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
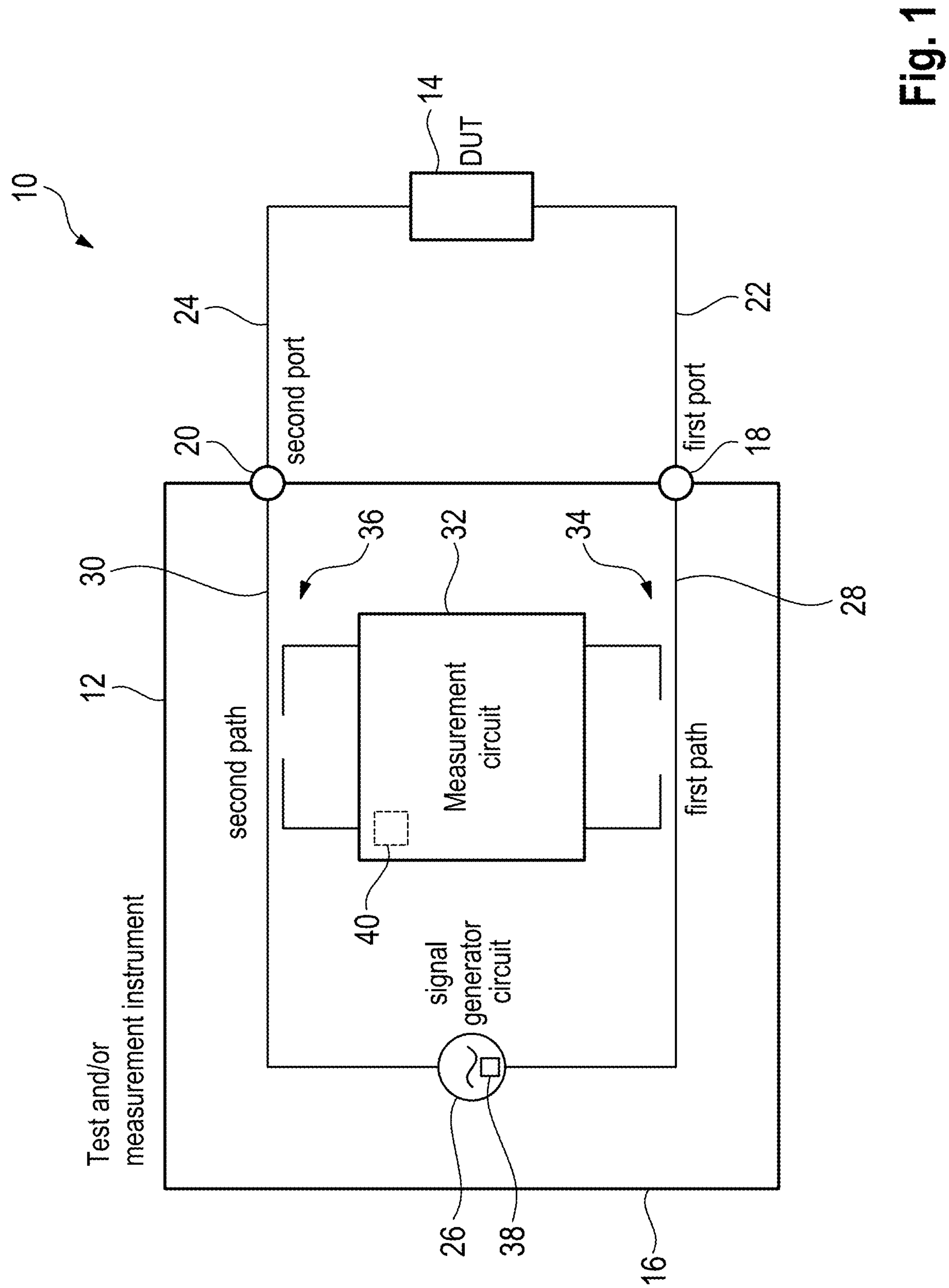
FIG. 1 schematically shows a test and/or measurement system according to an embodiment of the present disclosure, FIG. 2 schematically shows a test and/or measurement system according to another embodiment of the present disclosure, FIG. 3 schematically shows a test and/or measurement system according to still another embodiment of the present disclosure, FIG. 4 schematically shows an overview illustrating the difference between the test and/or measurement instrument according to the present disclosure compared to a test and/or measurement instrument known from the state of the art.

In FIG. 1, an example of a test and/or measurement system 10 for performing noise measurements is shown. The test and/or measurement system 10 comprises a test and/or measurement instrument 12 that can be realized by a vector network analyzer (VNA) or a spectrum analyzer (SA). The test and/or measurement instrument 12 is a single device that is formed separately with regard to a device under test 14 which is also part of the test and/or measurement system 10. The test and/or measurement instrument 12 comprises a housing 16 at which outer surface a first port 18 as well as a second port 20 are provided such that they are accessible.

As shown in FIG. 1, the device under test 14 is connected with both the first port 18 and the second port 20 via a respective line 22, 24, for instance a cable connection. The test and/or measurement instrument 12 further comprises a signal generator circuit 26 that is connected with the first port 18 via a first path 28 as well as with a second port 20 via a second path 30. The test and/or measurement instrument 12 also comprises a measurement circuit 32 that is coupled to the first path 28 and the second path 30 by a respective coupler 34, 36, namely a first coupler 34 and a second coupler 36. The couplers 34, 36 may be realized by directional couplers such that the measurement circuit 32 is galvanically isolated from the paths 28, 30 in the shown embodiment.

Since the test and/or measurement instrument 12 is a single device, the housing 16 encompasses the signal generator circuit 26 as well as the measurement circuit 32. The housing 16 of the test and/or measurement instrument 12 also encompasses the first path 28, the second path 30 as well as the couplers 34, 36.

In an embodiment, the signal generator circuit 26 may comprise at least one direct-digital-synthesis (DDS) circuit 38 as schematically illustrated in FIG. 1. The direct-digital-synthesis circuit 38 may have a phase register as will be described later in more detail.

In general, the signal generator circuit 26 is enabled to generate a test signal that is forwarded via the first path 28 to the first port 18 for being outputted. The measurement circuit 32, coupled with the first path 28 via the first coupler 34, receives the test signal via the first coupler 34 for further processing.

The test signal is forwarded to the device under test 14 by the first port 18 to which the device under test 14 is connected via the first line 22. Thus, the device under test 14 receives the test signal from the first port 18 of the test and/or measurement instrument 12. The device under test 14 processes the test signal, thereby generating a processed signal that is outputted via the second line 24 which is connected to the second port 20 of the test and/or measurement instrument 12.

Therefore, the processed signal is inputted to the test and/or measurement instrument 12 via the second port 20 such that the processed signal is forwarded by the second path 30. The processed signal, namely the test signal being processed by the device under test 14, corresponds to a measurement signal that is measured by the test and/or measurement instrument 12.

The measurement circuit 32, which receives the test signal, also receives the measurement signal from the second path 30 via the second coupler 36, namely the test signal being processed by the device under test 14. Accordingly, the measurement circuit 32 is enabled to process the originally generated test signal, e.g. the test signal before being processed by the device under test 14, and the measurement signal, namely the test signal being processed by the device under test 14.

Both signals received are processed by the measurement circuit 32 in order to determine a noise contribution of the device under test 14 to the measurement signal, namely by processing information about the test signal received and originally inputted to the device on test 14 as well as information about the measurement signal outputted by the device under test 14.

The noise contribution of the device on test 14 can be determined with high accuracy, as the test signal generated by the signal generator circuit 26 comprises a band-limited noise signal rather than a broadband noise signal. The band-limited noise signal ensures that no contribution to an image band occurs. This is schematically shown in FIG. 4.

Figure 4:
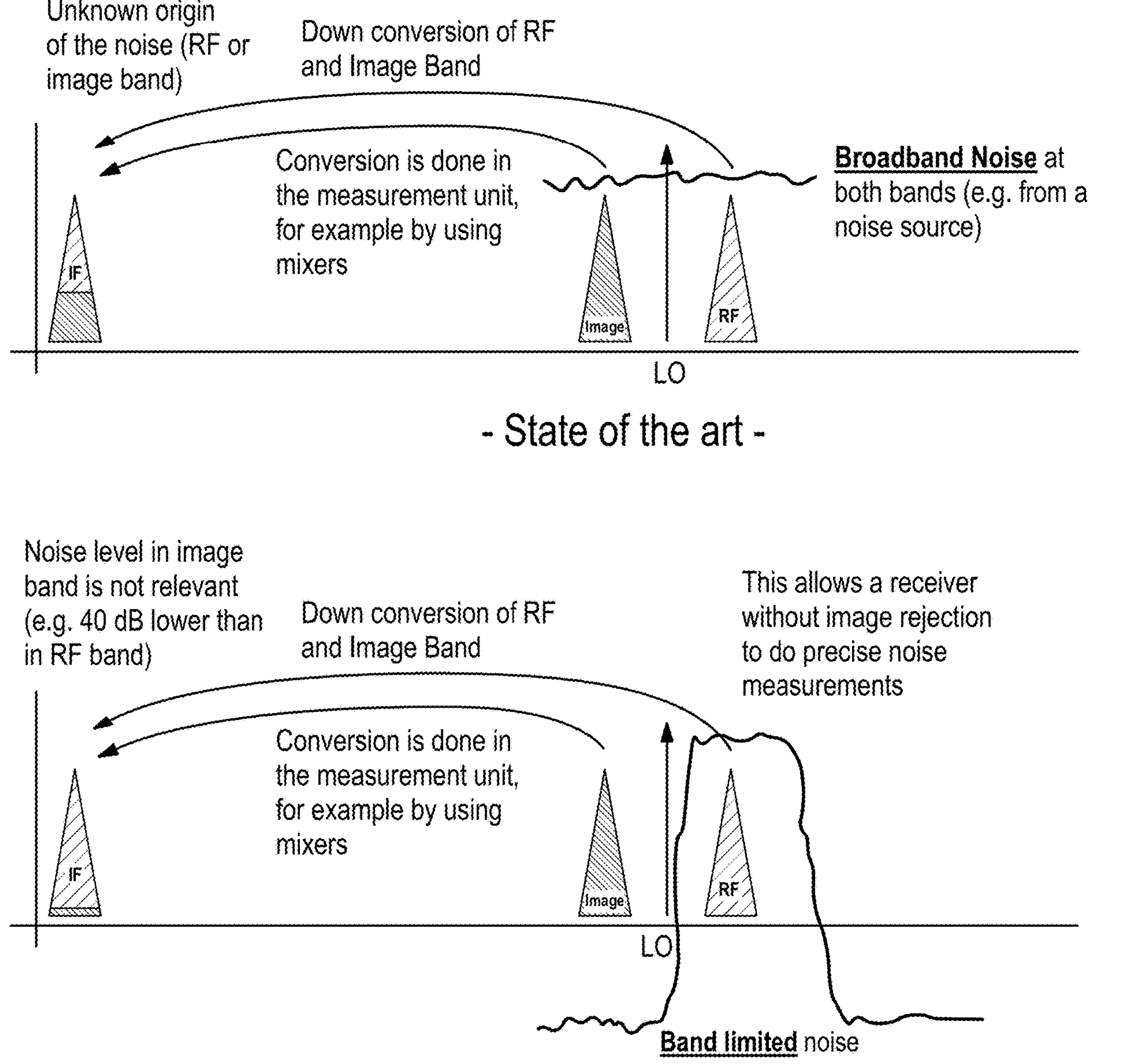

In the upper part of FIG. 4, the state of the art is shown which uses a broadband noise that is present at both bands, namely the radio frequency (RF) band and the image band. When the down-conversion of the signal takes place at the front end of the test and/or measurement instrument 12, e.g. the receiver side of the test and/or measurement instrument 12, both bands, namely the radio frequency (RF) band and the image band, are down-converted to the intermediate frequency (IF) by using the local oscillator (LO) signal such that the origin of noise is unknown in the intermediate frequency.

In contrast thereto, the lower part of FIG. 4 illustrates the concept of the subject matter of the present disclosure, namely using the band-limited noise signal that is only present at the radio frequency (RF) band. This allows the receiver side of the test and/or measurement instrument 12 to perform precise noise measurements of the device under test 14. In an embodiment, the noise level in the image band is not relevant at the intermediate frequency (IF), thereby ensuring the highly accurate noise measurements of the device under test 14.

Alternatively to the coupling of the measurement circuit 32 to the first path 28 via the first coupler 34, the measurement circuit 32 may also comprise an interface 40 shown by the dashed lines in FIG. 1. The measurement circuit 32 may receive a digital waveform of the test signal via the interface 40, namely a digital version of the test signal. For instance, the digital waveform is received from a storage medium that is connected to the measurement circuit 32 via the interface 40.

Besides the band-limited noise signal, the test signal may also comprise a continuous wave (CW) signal that is generated in parallel to the band-limited noise signal by the signal generator circuit 26, for example the DDS circuit 38.

Thus, the test signal comprises the continuous wave signal and the band-limited noise signal that overlaps the continuous wave signal. In other words, the continuous wave signal is buried in the band-limited noise signal. The CW signal can be used for driving the device under test 14, for example an internal amplifier of the device under test 14, into its non-linear regime. Due to the additional band-limited noise signal, the noise contribution of the device under test 14 can be determined for the non-linear regime as well.

Generally, the signal generator circuit 26 is enabled to sweep the continuous wave signal through a defined frequency band with defined frequency steps. The power level of the continuous wave signal and/or the band-limited noise signal may be changed for at least some of the defined frequency steps, for example for all frequency steps. In an embodiment, the signal generator circuit 26 may set the power level of the continuous wave signal such that the test signal generated causes a saturation of the device under test 14.

The DDS circuit 38 generally allows for a high flexibility and fast changing. In an embodiment, an output frequency of the at least one direct-digital-synthesis circuit 38 can be changed within each clock cycle of the at least one direct-digital-synthesis circuit 38 for at least two consecutive clock cycles. In an embodiment, the output frequency of the at least one direct-digital-synthesis circuit 38 may be changed by amending a phase register of the at least one direct-digital-synthesis circuit 38.

Generally, the measurement circuit 32 may also consider an amplification of the device under test 14 and/or a noise contribution of the second path 30 when determining the noise contribution of the device under test 14 to the measurement signal. Again, the accuracy is improved.

In an embodiment, the test and/or measurement instrument 12 comprises a calibration mode, wherein the first port 18 is connected with the second port 20 via a line in the calibration mode, which is used for connecting the device under test 14. Hence, the first line 22 or the second line 24 may be used for directly interconnecting the first port 18 and the second port 20 with each other, namely without the device under test 14.

Thus, the measurement circuit 32 measures the test signal forwarded to the second path 30 from the first port 18 via the line interconnecting both ports 18, 20 in order to determine the band-limited noise signal as part of the measured test signal. Hence, any internal noise contributors in the second path 20 may be determined accordingly.

Figure 2:
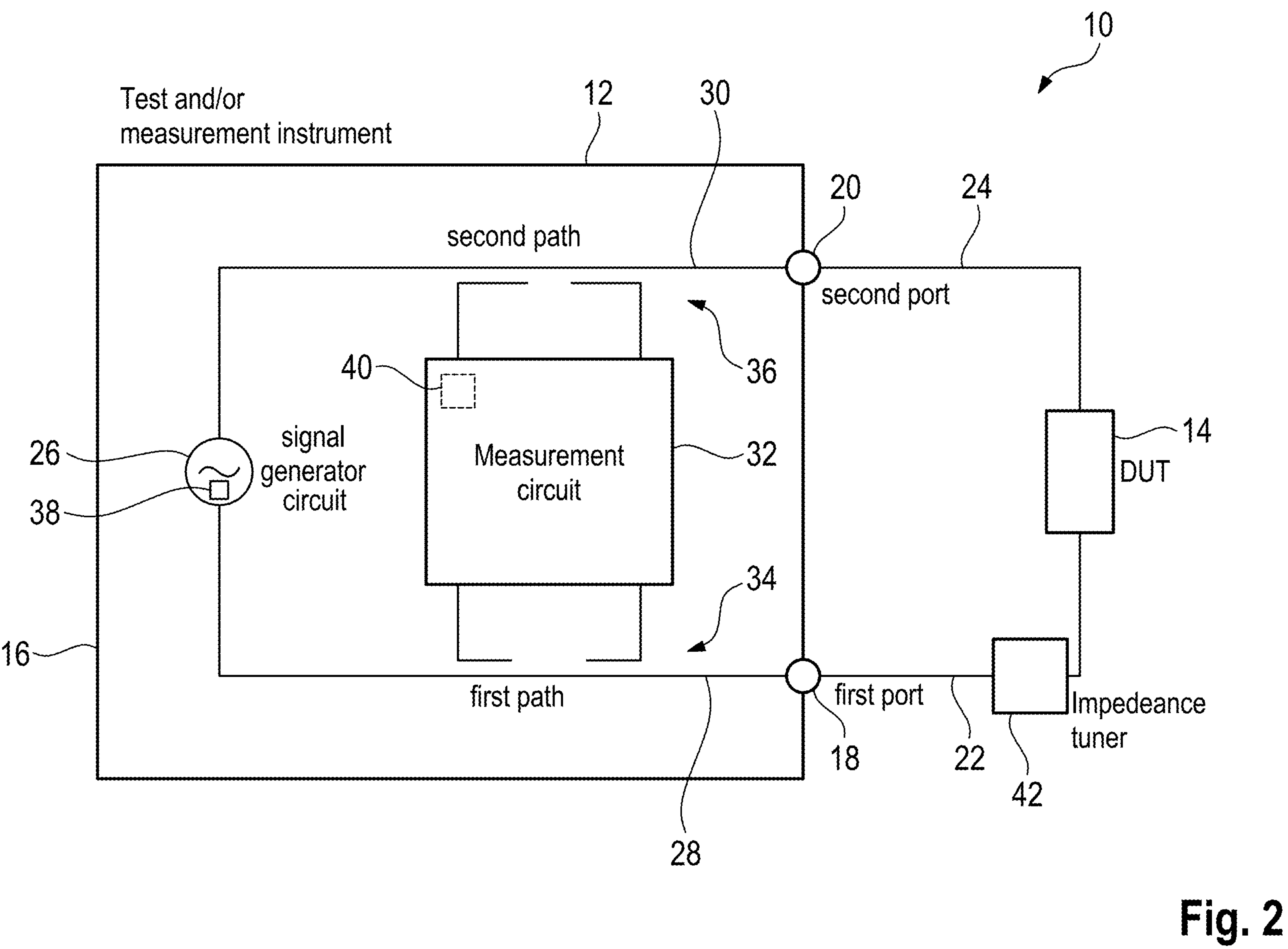

In FIG. 2, another embodiment of the test and/or measurement system 10 is shown, wherein a separately formed impedance tuner 42 is provided, which is arranged between the first port 18 and the device on test 14. Alternatively, the impedance tuner 42 may also be located between the device on test 14 and the second port 20.

The impedance tuner 42 is used for calibration of the test and/or measurement system 10. In an embodiment, noise contributions of the second path 30 and a receiver side of the measurement circuit 32 and/or the device under test 14 can be determined. Afterwards, the noise contribution of the device on test 14 to the measurement signal can be determined with higher accuracy.

Figure 3:
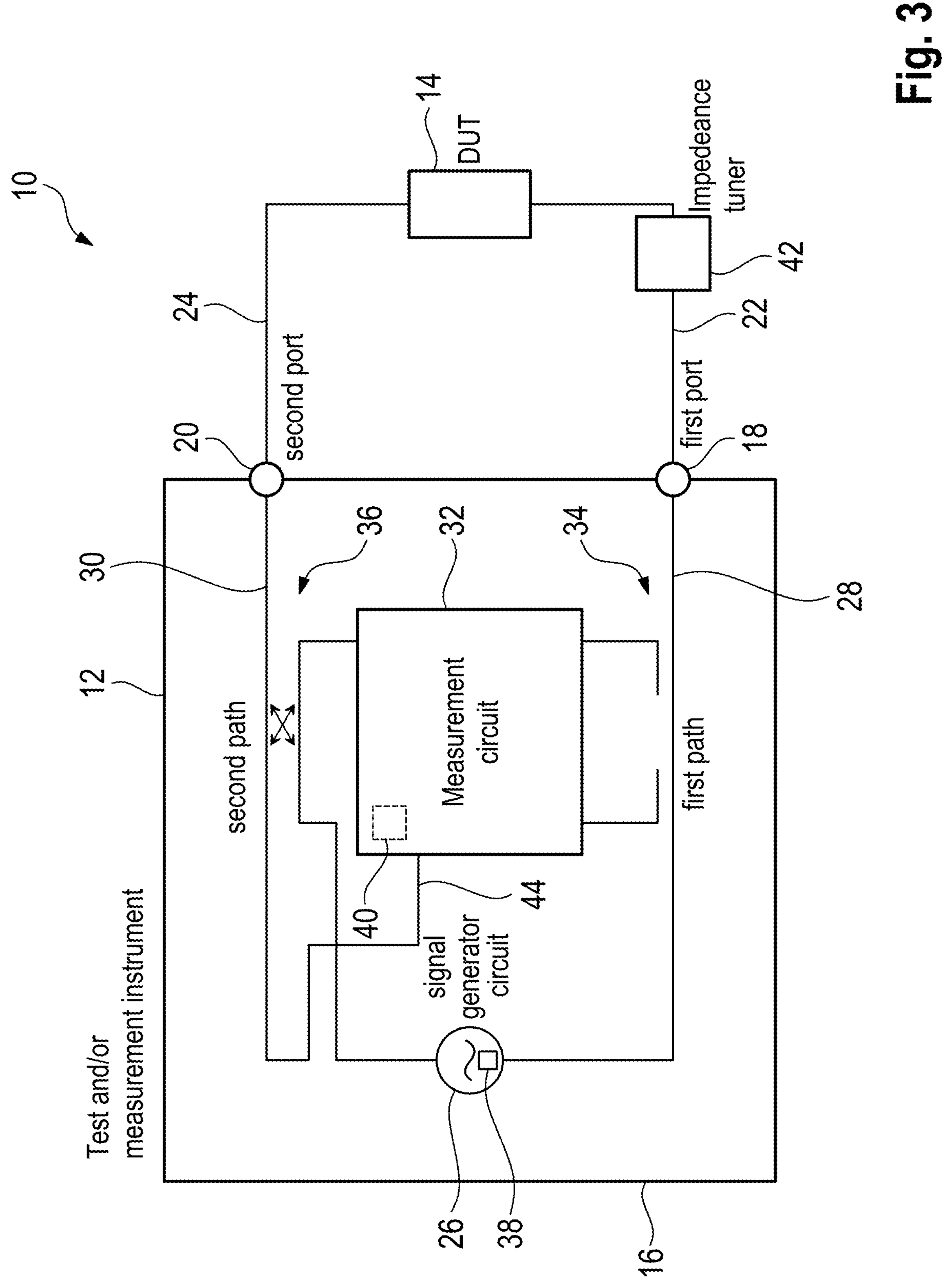

In FIG. 3, another embodiment of the test and/or measurement system 10 is shown, wherein the second path 30 is connected with the measurement circuit 28 via a line 44 rather than via the second coupler 36. The connection via the line 44 ensures that the noise contribution can be determined with higher accuracy.

In general, the measurement circuit 28 is enabled to calculate noise figures of the device under test based on the noise contribution determined for the device under test 14. The noise figure may be calculated by using the Y factor technique for noise figure measurements.

Figure 5:
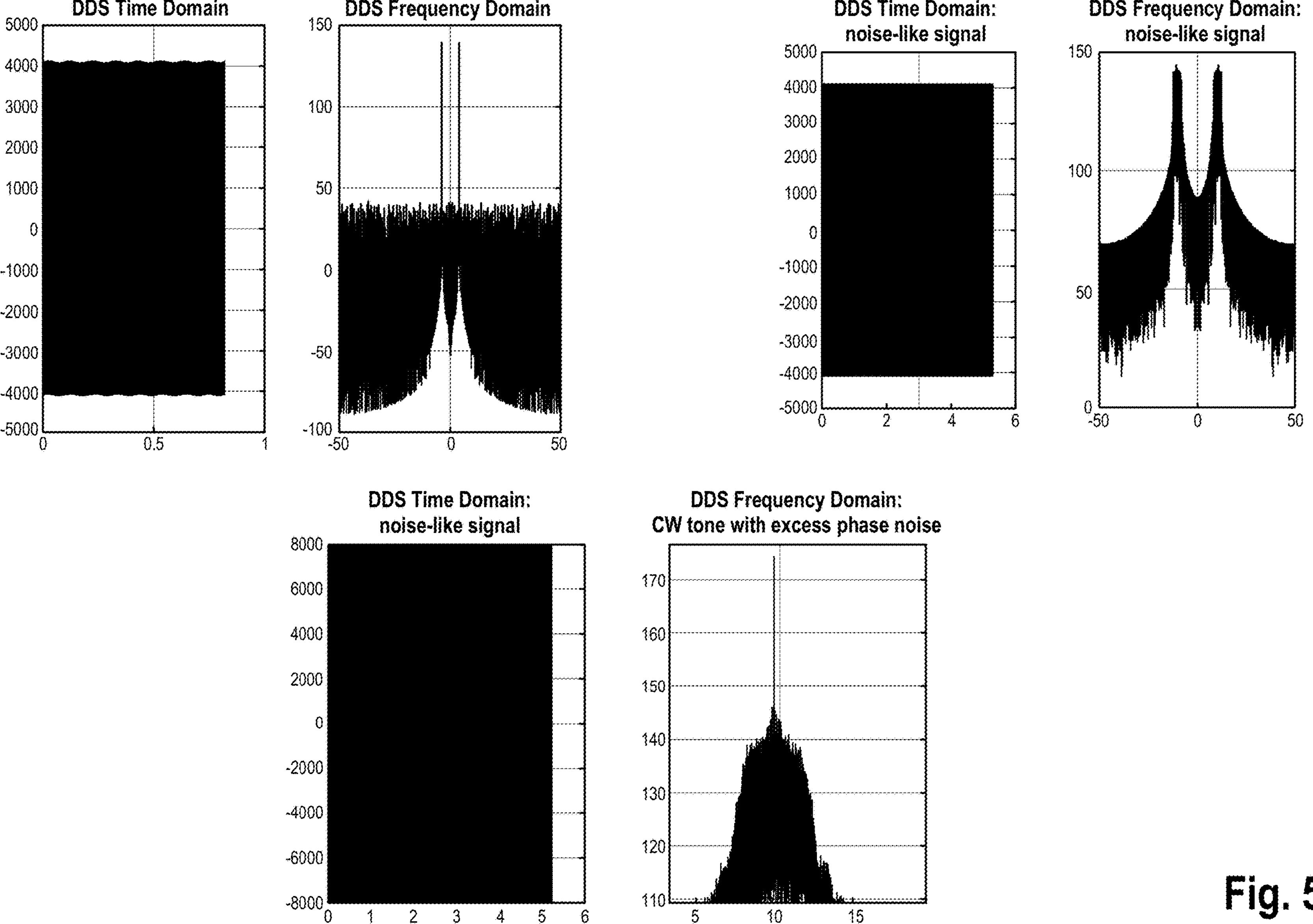
FIG. 5 shows an overview of signals provided by the direct-digital-synthesis circuit of the signal generator circuit used in the test and/or measurement instrument according to the present disclosure.

FIG. 5 generally shows diagrams of signals provided by the signal generator circuit 26, for example the direct-digital-synthesis (DDS) circuit 38, in time domain and in frequency domain. The diagrams show a single tone signal generated in the upper part, a noise-like signal in the middle part, and a CW tone with excess phase noise in the lower part.

These different signal shapes can be generated by the signal generator circuit 26, for example the direct-digital-synthesis (DDS) circuit 38, for measuring the noise contribution of the device under test 14. Hence, faster and more accurate noise figure measurements are possible, as it is not necessary to perform several measurements for different local oscillator frequencies.

In addition, the combination of the CW signal and the band-limited noise signal ensure noise measurements in the non-linear regime of the device under test 14.

Furthermore, excess phase noise measurements can be performed, as shaped-noise around a CW tone is possible due to the signal generator circuit 26, for example the direct-digital-synthesis (DDS) circuit 38.

Certain embodiments disclosed herein include systems, apparatus, modules, units, devices, components, etc., that utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes an implementation comprising one or more processors or portions thereof and accompanying software, firmware, hardware, and the like.

For example, the functionality described herein can be implemented by special purpose hardware-based computer systems or circuits, etc., or combinations of special purpose hardware and computer instructions. Each of these special purpose hardware-based computer systems or circuits, etc., or combinations of special purpose hardware circuits and computer instructions form specifically configured circuits, machines, apparatus, devices, etc., capable of implementing the functionality described herein.

Of course, in an embodiment, two or more of these components, or parts thereof, can be integrated or share hardware and/or software, circuitry, etc. In an embodiment, these components, or parts thereof, may be grouped in a single location or distributed over a wide area. In circumstances where the components are distributed, the components are accessible to each other via communication links.

In an embodiment, one or more of the components, such as test and/or measurement instrument 12, the DUT 14, the impedance tuner 42, etc., referenced above include circuitry programmed to carry out the functionality disclosed herein. In an embodiment, one or more computer-readable media associated with or accessible by such circuitry contains computer readable instructions embodied thereon that, when executed by such circuitry, cause the component or circuity to carry out the functionality disclosed herein.

In an embodiment, the computer readable instructions includes applications, programs, program modules, scripts, source code, program code, object code, byte code, compiled code, interpreted code, machine code, executable instructions, and/or the like (also referred to herein as executable instructions, instructions for execution, program code, computer program instructions, and/or similar terms used herein interchangeably).

In an embodiment, computer-readable media is any medium that stores computer readable instructions, or other information non-transitorily and is directly or indirectly accessible to a computing device, such as processor circuitry, etc., or other circuity disclosed herein etc. In other words, a computer-readable medium is a non-transitory memory at which one or more computing devices can access instructions, codes, data, or other information. As a nonlimiting example, a computer-readable medium may include a volatile random access memory (RAM), a persistent data store such as a hard disk drive or a solid-state drive, or a combination thereof. In an embodiment, memory can be integrated with a processor, separate from a processor, or external to a computing system.

Accordingly, blocks of the block diagrams and/or flowchart illustrations support various combinations for performing the specified functions, combinations of operations for performing the specified functions and program instructions for performing the specified functions. These computer program instructions may be loaded onto one or more computer or computing devices, such as special purpose computer(s) or computing device(s) or other programmable data processing apparatus(es) to produce a specifically-configured machine, such that the instructions which execute on one or more computer or computing devices or other programmable data processing apparatus implement the functions specified in the flowchart block or blocks and/or carry out the methods described herein. Again, it should also be understood that each block of the block diagrams and flowchart illustrations, and combinations of blocks in the block diagrams and/or flowchart illustrations, or portions thereof, could be implemented by special purpose hardware-based computer systems or circuits, etc., that perform the specified functions or operations, or combinations of special purpose hardware and computer instructions.

In the foregoing description, specific details are set forth to provide a thorough understanding of representative embodiments of the present disclosure. It will be apparent to one skilled in the art, however, that the embodiments disclosed herein may be practiced without embodying all of the specific details. In some instances, well-known process steps have not been described in detail in order not to unnecessarily obscure various aspects of the present disclosure.

In the detailed description herein, references to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. In addition, when a particular feature, structure, or characteristic is described in connection with an embodiment, it is submitted that it is within the knowledge of one skilled in the art to affect such feature, structure, or characteristic in connection with other embodiments whether or not explicitly described. After reading the description, it will be apparent to one skilled in the relevant art(s) how to implement the disclosure in alternative embodiments. Thus, it will be appreciated that embodiments of the present disclosure may employ any combination of features described herein. All such combinations or sub-combinations of features are within the scope of the present disclosure.

Throughout this specification, terms of art may be used. These terms are to take on their ordinary meaning in the art from which they come, unless specifically defined herein or the context of their use would clearly suggest otherwise.

The drawings in the FIGURES are not to scale. Similar elements are generally denoted by similar references in the FIGURES. For the purposes of this disclosure, the same or similar elements may bear the same references. Furthermore, the presence of reference numbers or letters in the drawings cannot be considered limiting, even when such numbers or letters are indicated in the claims.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about," "approximately," "near," etc., mean plus or minus 5% of the stated value. For the purposes of the present disclosure, the phrase "at least one of A and B" is equivalent to "A and/or B" or vice versa, namely "A" alone, "B" alone or "A and B.". Similarly, the phrase "at least one of A, B, and C," for example, means (A), (B), (C), (A and B), (A and C), (B and C), or (A, B, and C), including all further possible permutations when greater than three elements are listed.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. An instrument for noise measurements of a device under test, instrument comprising:

a signal generator circuit configured to generate a test signal comprising a band-limited noise signal;

a first port connectable to the device under test;

a second port connectable to the device under test;

a first path connected with the first port and the signal generator circuit such that the test signal generated by the signal generator circuit is forwarded to the first port via the first path;

a second path connected with the second port;

a measurement circuit that receives a measurement signal from the second path, which corresponds to the test signal being processed by the device under test, wherein the measurement circuit is configured to receive the test signal from the first path or to receive a digital waveform of the test signal, and wherein the measurement circuit is configured to determine a noise contribution of the device under test to the measurement signal based on the test signal received and the measurement signal received from the second path;

wherein the signal generator circuit comprises at least one direct-digital-synthesis (DDS) circuit that is configured to generate the band-limited noise signal, or wherein the measurement circuit is configured to consider at least one of an amplification of the device under test or a noise contribution of the second path, when determining the noise contribution of the device under test to the measurement signal.

2. The instrument according to claim 1, wherein the measurement circuit is coupled with the first path.

3. The instrument according to claim 1, wherein the first path and the second path both are coupled with the measurement circuit by a respective coupler or wherein the second path is electrically connected with the measurement circuit by a line.

4. The instrument according to claim 1, wherein the second path is connected with the signal generator circuit.

5. The instrument according to claim 1, further comprising a housing that encompasses the signal generator circuit and the measurement circuit.

6. The instrument according to claim 1, wherein the signal generator circuit is configured to generate a continuous wave signal in parallel to the band-limited noise signal such that the test signal comprises the continuous wave signal and the band-limited noise signal that overlaps the continuous wave signal.

7. The instrument according to claim 6, wherein the signal generator circuit is configured to set the power level of the continuous wave signal such that the test signal generated causes a saturation of the device under test.

8. The instrument according to claim 6, wherein the signal generator circuit is configured to sweep the continuous wave signal through a defined frequency band with defined frequency steps.

9. The instrument according to claim 8, wherein the signal generator circuit is configured to change a power level of the continuous wave signal and/or the band-limited noise signal at least for some of the defined frequency steps.

10. The instrument according to claim 1, wherein the measurement circuit is coupled with the first path such that the measurement circuit is configured to receive the test signal from the first path and to digitize the test signal received, thereby generating a digitized test signal based on which the noise contribution of the device under test to the measurement signal is determined.

11. The instrument according to claim 1, wherein the measurement circuit is configured to receive a digital waveform of the test signal from a storage medium, and wherein the measurement circuit is configured to calculate the noise contribution of the device under test to the measurement signal based on the digital waveform received.

12. The instrument according to claim 1, wherein the test and/or measurement instrument comprises a calibration mode, wherein the first port is connected with the second port via a line in the calibration mode, which is used for connecting the device under test, and wherein the measurement circuit is configured to measure the test signal forwarded to the second path in order to determine the band-limited noise signal as part of the measured test signal.

13. The instrument according to claim 1, wherein the measurement circuit is configured to calculate a noise figure of the device under test based on the noise contribution of the device under test.

14. The instrument according to claim 1, wherein the signal generator circuit is configured to change an output frequency of the at least one direct-digital-synthesis circuit within each clock cycle of the at least one direct-digital-synthesis circuit for at least two consecutive clock cycles.

15. The instrument according to claim 1, wherein the signal generator circuit is configured to change an output frequency of the at least one direct-digital-synthesis circuit by amending a phase register of the at least one direct-digital-synthesis circuit.

16. The instrument according to claim 1, wherein the instrument is a vector network analyzer or a spectrum analyzer.

17. A system for noise measurements, wherein the system comprises the device under test and the instrument according to claim 1, and wherein the device under test is connected with the first port and the second port of the test and/or measurement instrument.

18. The system according to claim 17, further comprising an impedance tuner that is arranged between the first port and the device under test or between the second port and the device under test.

19. A system for noise measurements, comprising:

a device under test; and an instrument for noise measurements of a device under test, wherein the instrument includes a signal generator circuit configured to generate a test signal comprising a band-limited noise signal;

a first port connectable to the device under test;

a second port connectable to the device under test;

a first path connected with the first port and the signal generator circuit such that the test signal generated by the signal generator circuit is forwarded to the first port via the first path;

a second path connected with the second port;

a measurement circuit that receives a measurement signal from the second path, which corresponds to the test signal being processed by the device under test, wherein the measurement circuit is configured to receive the test signal from the first path or to receive a digital waveform of the test signal, and wherein the measurement circuit is configured to determine a noise contribution of the device under test to the measurement signal based on the test signal received and the measurement signal received from the second path, wherein the device under test is connected with the first port and the second port of the instrument, and wherein the system further comprises an impedance tuner that is arranged between the first port and the device under test or between the second port and the device under test.

20. An instrument for noise measurements of a device under test, the instrument comprising:

a signal generator circuit configured to generate a test signal comprising a band-limited noise signal;

a first port connectable to the device under test;

a second port connectable to the device under test;

a first path connected with the first port and the signal generator circuit such that the test signal generated by the signal generator circuit is forwarded to the first port via the first path;

a second path connected with the second port;

a measurement circuit that receives a measurement signal from the second path, which corresponds to the test signal being processed by the device under test, wherein the measurement circuit is coupled with the first path and configured to receive the test signal from the first path, wherein the measurement circuit is configured to determine a noise contribution of the device under test to the measurement signal, and wherein the measurement circuit is configured to determine the noise contribution based on the test signal received from the first path and the measurement signal received from the second path.

* * * * *